United States Patent
Newlin et al.

(10) Patent No.: US 7,561,085 B2
(45) Date of Patent: Jul. 14, 2009

(54) SYSTEMS AND METHODS FOR IMPROVING DATA CONVERTERS

(75) Inventors: Matthew P. Newlin, Seattle, WA (US); Lee K. Strandjord, Tonka Bay, MN (US); Thomas C. Greening, Peoria, AZ (US); Gregory W. Keith, Glendale, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/689,377

(22) Filed: Mar. 21, 2007

(65) Prior Publication Data

US 2008/0231485 A1 Sep. 25, 2008

(51) Int. Cl.
*H03M 1/20* (2006.01)
(52) U.S. Cl. .................. 341/131; 341/155; 341/144
(58) Field of Classification Search .......... 341/143, 341/144, 155, 145, 131
See application file for complete search history.

(56) References Cited

U.S. PATENT DOCUMENTS

| | | | | |
|---|---|---|---|---|
| 4,901,265 | A * | 2/1990 | Kerr et al. | 708/276 |
| 5,525,984 | A | 6/1996 | Bunker | |
| 6,000,481 | A | 12/1999 | Heller et al. | |
| 6,173,003 | B1 * | 1/2001 | Whikehart et al. | 375/130 |
| 6,195,669 | B1 * | 2/2001 | Onodera et al. | 708/3 |
| 6,198,416 | B1 | 3/2001 | Velazquez | |
| 6,344,810 | B2 | 2/2002 | Velazquez | |
| 6,370,289 | B1 | 4/2002 | Bennett | |
| 6,424,275 | B1 | 7/2002 | Velazquez | |
| 6,570,514 | B1 | 5/2003 | Velazquez | |
| 6,639,530 | B2 * | 10/2003 | Jensen et al. | 341/143 |
| 7,002,495 | B1 * | 2/2006 | Batruni | 341/118 |
| 7,015,853 | B1 * | 3/2006 | Wolff et al. | 341/155 |
| 2002/0121993 | A1 | 9/2002 | Velazquez | |
| 2007/0024384 | A1 * | 2/2007 | Muecke et al. | 331/78 |

FOREIGN PATENT DOCUMENTS

JP 62125743 6/1987

OTHER PUBLICATIONS

Chen-Yang Pan et al, Pseudorandom Testing for Mixed-Signal Circuits, IEEE, Oct. 1997, pp. 1173-1185, vol. 16, No. 10.
Kuo S M et al, Active Noise Control: A Tutorial Review, Proceedings of the IEEE, Jun. 1, 1999, pp. 943-973, vol. 87, No. 6.
Farahani B J et al, Adaptive Sigma Delta ADC for WIMAX Fixed Point Wireless Application, IEEE, Aug. 7, 2005, pp. 692-695.

* cited by examiner

*Primary Examiner*—Brian Young

(57) ABSTRACT

Systems and methods for improving efficiency of a data converter. An example method generates a noise signal, alters the spectrum of the noise signal based on operation of an associated data converter, and supplies the altered spectrum noise signal to the associated data converter. The data converter is a digital-to-analog converter or an analog-to-digital converter. The altered spectrum noise signal is notched at frequencies of interest. The spectrum is altered by sending a signal generated by a random number generator to a delay device and adding the output of the delay device from the output of the random number generator. Also, the spectrum is altered by seeding first and second identical random number generators, delaying the operation of the first random number generator, and adding the output of the delayed first random number generator from the second random number generator.

13 Claims, 8 Drawing Sheets

SYSTEMS AND METHODS FOR IMPROVING DATA CONVERTERS

BACKGROUND OF THE INVENTION

High performance systems (FIG. 1) employing analog-to-digital converters (ADCs) or digital-to-analog converters (DACs) and demodulators require high resolution converters. The performance of the systems can be limited by the resolution (number of bits) of the included converters. One solution is to increase the number of bits of the converter, which improves the resolution of the converters. However, this increases costs, power consumption, and size and results in slow performance.

Another solution for improving converter resolution and differential linearity is to add noise and averaging. However, injecting noise into the converter increases undesirable noise in the system/sensor output.

Therefore, there exists a need for improving the resolution of converters without adding significant cost or power consumption and without decreasing the speed of the converter.

SUMMARY OF THE INVENTION

The present invention provides systems and methods for improving efficiency of a data converter. An example method generates a noise signal, alters the spectrum of the noise signal based on operation of an associated data converter, and supplies the altered spectrum noise signal to the associated data converter.

The data converter is a digital-to-analog converter or an analog-to-digital converter. The altered spectrum noise signal is notched. The notches occur at frequencies of interest.

In one aspect of the invention, the spectrum is altered by sending a signal generated by a random number generator to a delay device and adding the output of the delay device from the output of the random number generator.

In another aspect of the invention, the spectrum is altered by seeding first and second identical random number generators, delaying the operation of the first random number generator, and adding the output of the delayed first random number generator from the second random number generator.

BRIEF DESCRIPTION OF THE DRAWINGS

Preferred and alternative embodiments of the present invention are described in detail below with reference to the following drawings.

DETAILED DESCRIPTION OF THE PREFERRED EMBODIMENT

Figure 1:
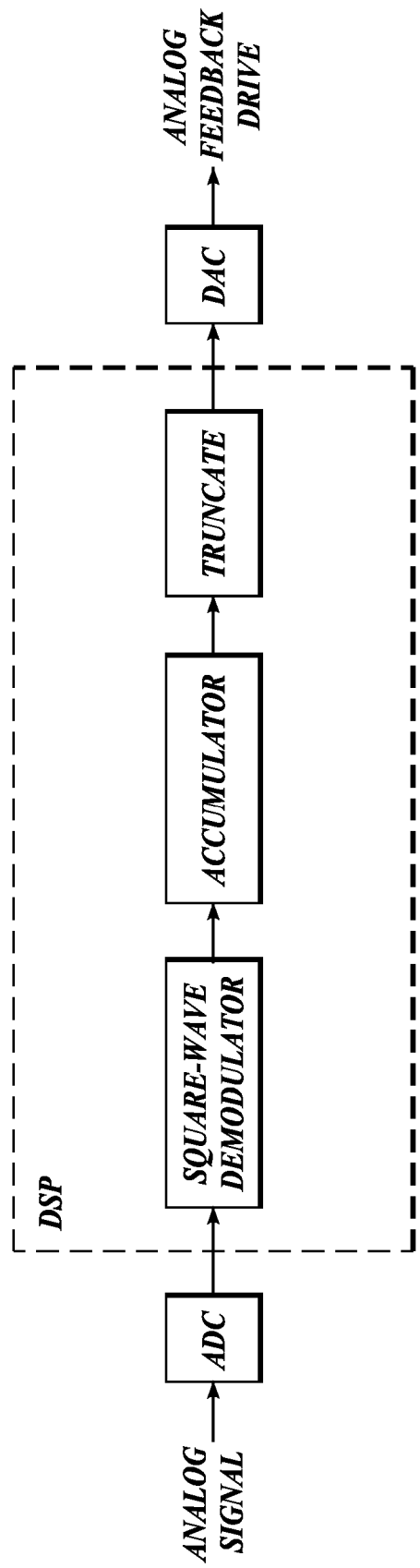
FIG. 1 illustrates components typical in a digital processing sensor system as formed in accordance with the prior art.
Figure 2:
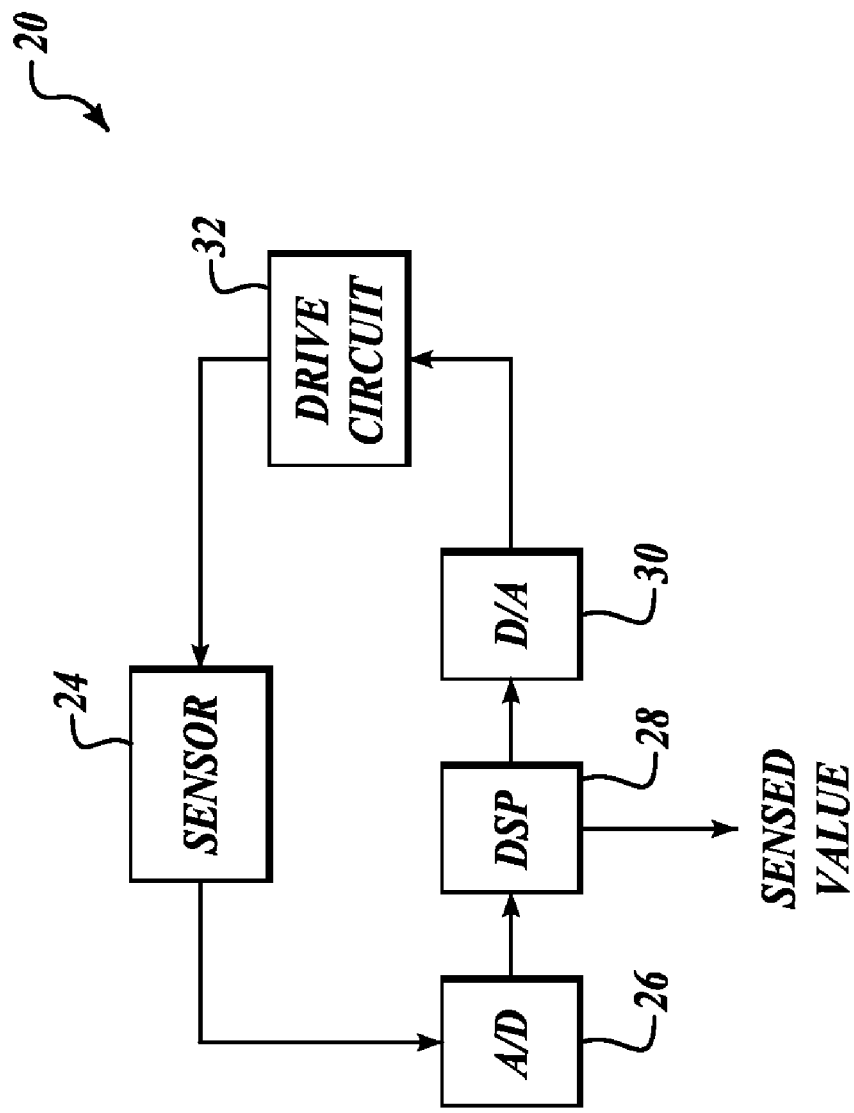
FIG. 2 illustrates an example system formed in accordance with an embodiment of the present invention.

FIG. 2 illustrates an example sensor system 20 formed in accordance with an embodiment of the present invention. The system 20 includes an analog sensor 24, an analog-to-digital converter (ADC) 26, a digital signal processor 28, a digital-to-analog converter (DAC) 30, and a drive circuit 32. The sensor 24 may be any of a number of different types of sensors, for example fiber-optic sensors and gyros (e.g., FOGs). Many sensors, such as the fiber-optic gyro, employ a sinusoidal or square-wave modulation signal at a specific frequency to generate an output signal at the specific frequency that is indicative of the parameter to be sensed. One advantage of the modulation is to shift the measurement away from low frequency drift errors and 1/f noise to a frequency that has no drift errors and lower noise. Furthermore, the modulation also allows the use of synchronous demodulation, such as a lock-in amplifier, which provides a means of extracting a very weak signal from noise.

The sensor 24 generates an analog signal at a specific frequency or specific frequencies, that is converted to digital by the ADC 26 that is then processed by the digital signal processor 28. The digital signal processor 28 performs synchronous demodulation, which down converts the sense signal back to base-band. The digital signal processor 28 outputs a sense value as well as a drive signal that is converted to analog by the DAC 30. The output of the DAC 30 is sent to the drive circuit 32 for amplification of a drive signal that is sent to the sensor 24 for completing closed-loop operation of the system 20. The present invention may be implemented in an open-loop system.

The digital signal processor 28 includes components for generating noise and applying the generated noise to either one of the converters 26 and 30 in order to increase the efficiency of the operation of the converters 26 and 30. The noise generated by the DSP 28 is minimal at the base-band frequency and the even harmonics of the synchronous demodulation frequency for the data converter 30, and is minimal at the synchronous modulation frequency and odd harmonics thereof for data converter 26. Therefore, the generated noise does not interfere with the operation of the converters 26 and 30.

Figure 3:
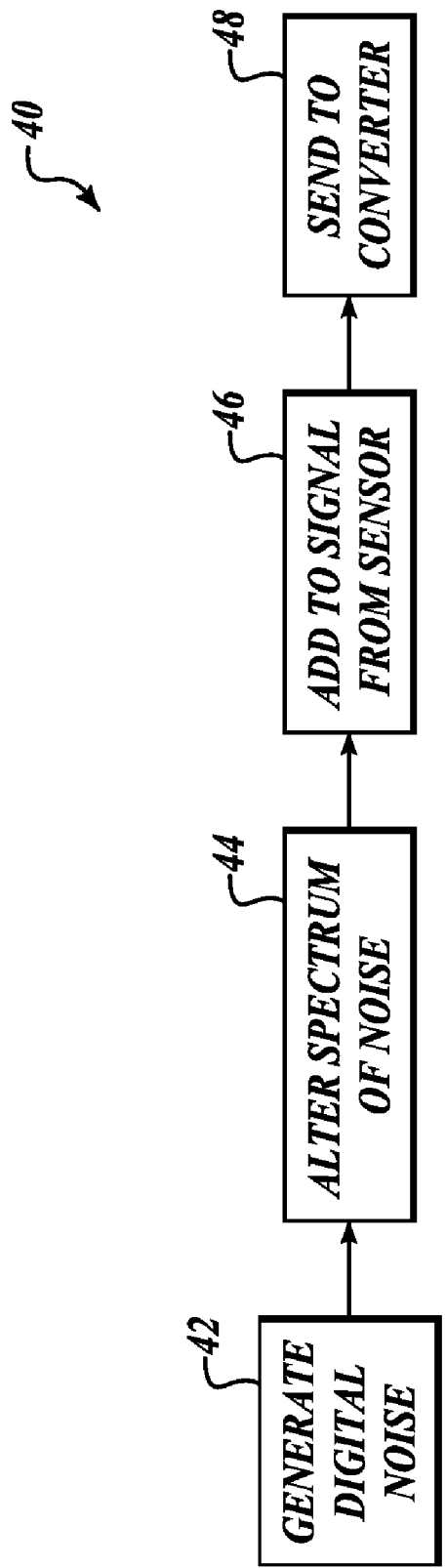
FIG. 3 illustrates a flow diagram of an example process performed by the system shown in FIG. 2.

FIG. 3 illustrates a flow diagram of an example process 40 performed by the system 20 shown in FIG. 2. First, at a block 42, digital noise is generated by the processor 28. Next, at a block 44, the spectrum of the generated digital noise is altered in order to reduce the amount of noise located at a predefined base-band that is equivalent to the base-band operation of the converters 26 or 30. At a block 46, the altered noise is added to the signal that is received by either one of the converters 26 or 30, then the combined signal is sent to the respective converter, block 48.

The noise (e.g., Gaussian noise) is generated digitally using commonly known techniques. The spectrum of the noise is altered by any of a number of different methods. Examples of two different methods for altering the spectrum are shown in FIGS. 6 and 7.

Figure 4:
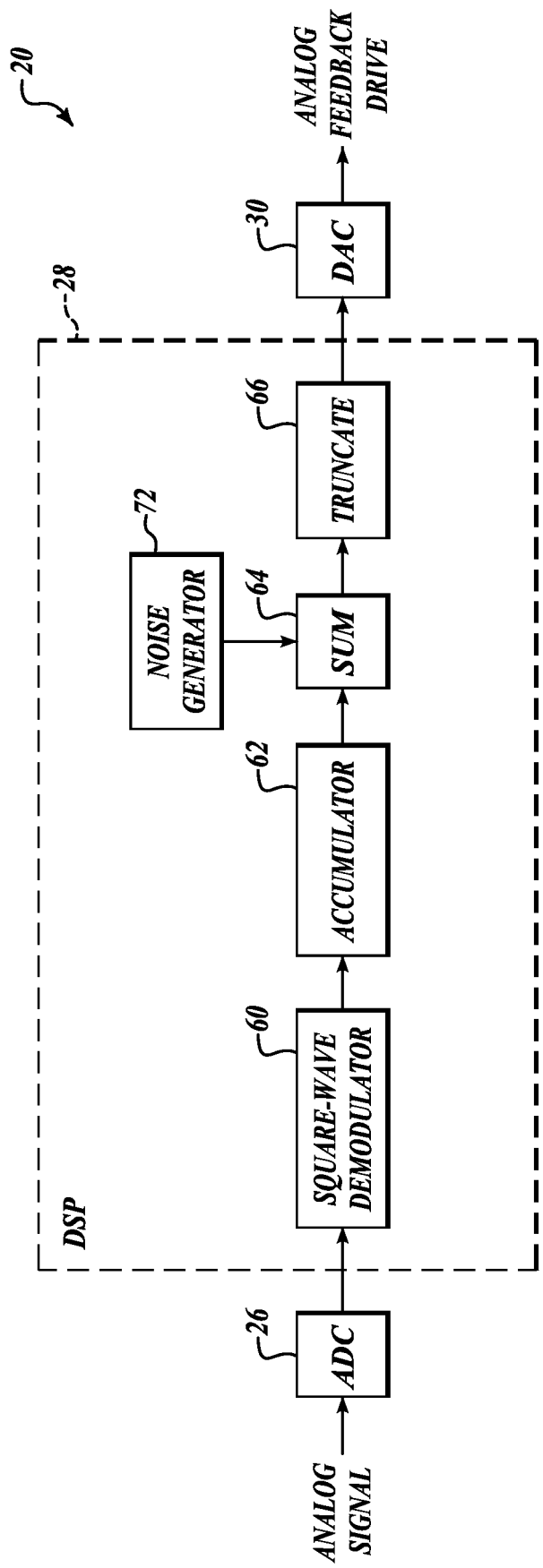
FIGS. 4 and 5 illustrate systems formed in accordance with various embodiments of the present invention.

FIG. 4 illustrates an example of a first embodiment as applied to the DAC 30. The processor 28 includes a square-wave demodulator 60 that receives a digital signal generated by the ADC 26. An accumulator 62 receives the output of the demodulator 60. The output of accumulator 62 is combined at a summator 64 with noise generated by a noise generator 72. The output of the summator 64 is truncated at block 66 and then output to the DAC 30. Noise near zero frequency and at the even harmonics of the square-wave demodulation frequency that is on the analog feedback drive contributes to measurement noise. Therefore, the noise generator 72 generates a noise spectrum that has reduced noise at these frequencies.

Figure 5:
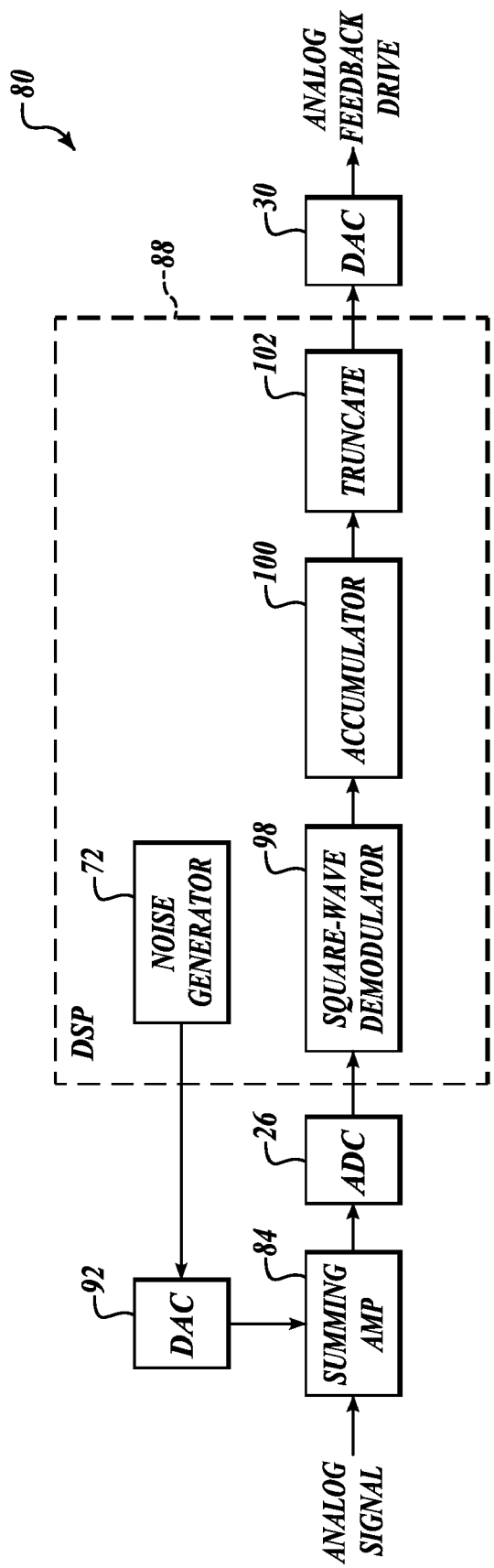

As shown in FIG. 5, a system 80 applies noise to the ADC 26. The system 80 includes a processor 88 that includes a square-wave demodulator 98, an accumulator 100, and a truncate element 102 that operate in accordance with the prior art. A noise generator 72 generates noise that is sent to another DAC 92. The DAC 92 outputs an analog signal to a summing amplifier 84 that adds the analog version of the noise to the analog signal from the sensor 24 and supplies it to the ADC 26. Noise at the square-wave demodulation frequency and odd harmonics thereof will contribute to measurement noise. Therefore, the noise generator 72 in this case generates a noise spectrum that has reduced noise at these frequencies.

Figure 6:
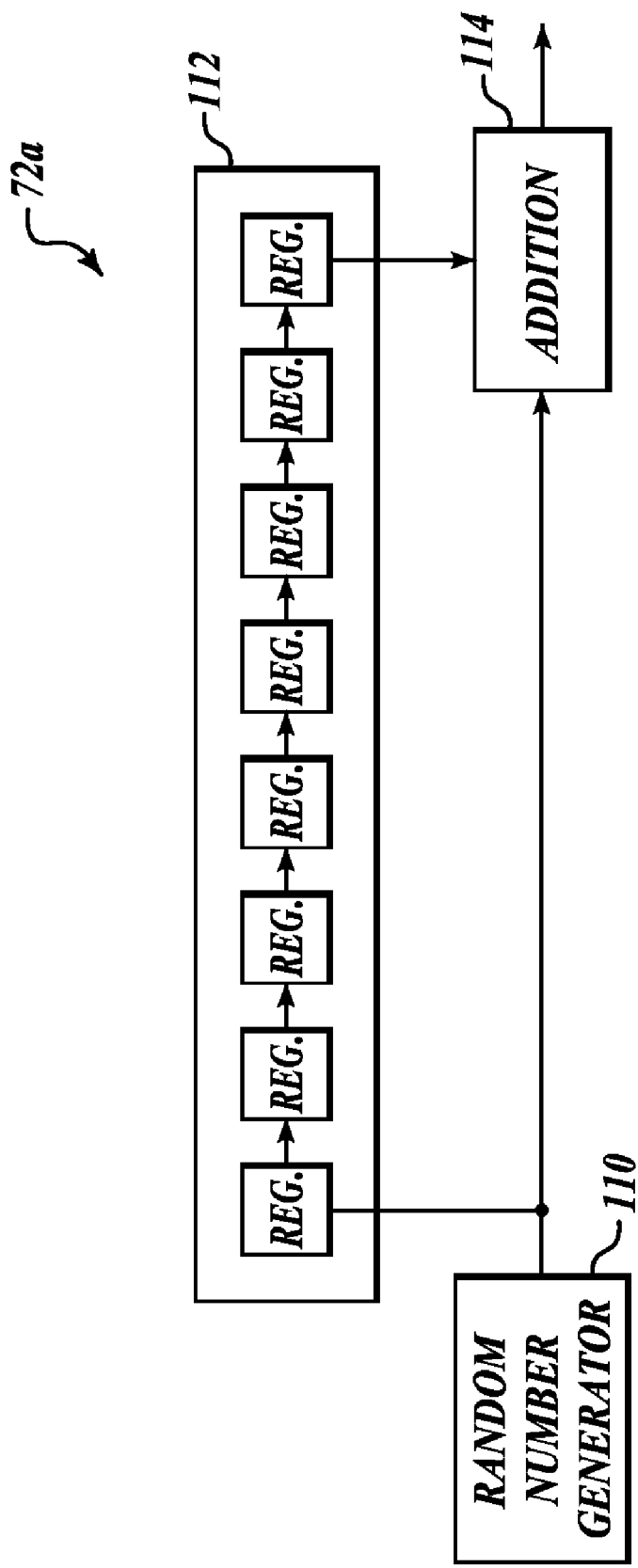
FIGS. 6 and 7 illustrate components for supplying noise for either of the systems shown in FIGS. 4 and 5.
Figure 7:
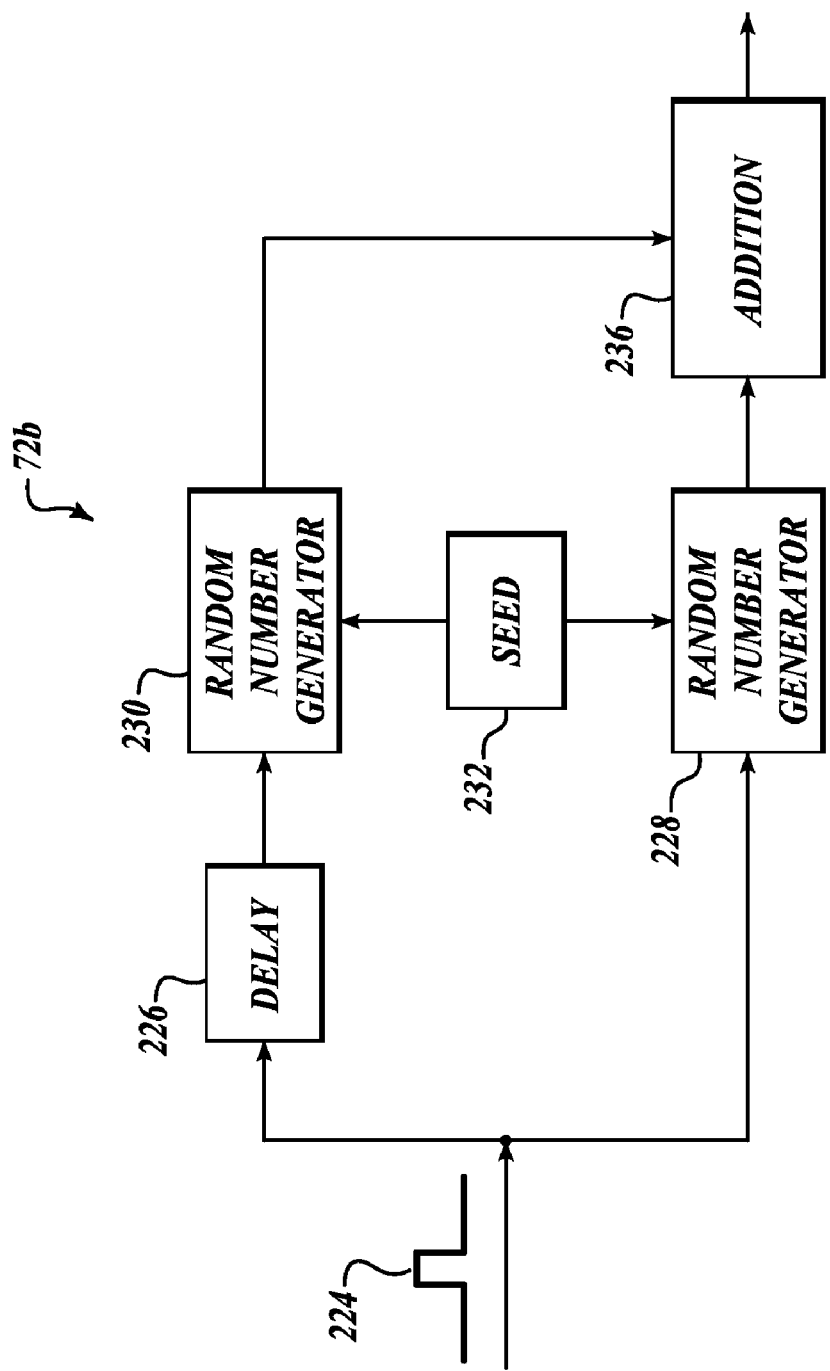

As shown in FIG. 6, a noise generator 72a includes a random number generator 110, a delay device 112, and an addition component 114. The random number generator 110 is a digital random number generator that generates a random number that is then sent to the delay device 112 and to the addition component 114. The delay device 112 includes a plurality of delay registers that perform a time delay of the received digital signal. The addition component 114 receives the output of the last register of the delay device 112 and adds that from the random number outputted by the random number generator 110. Because the delay causes a 180 degree phase shift of Fourier components at the desired notch frequencies, adding the two signals will result in subtraction of the Fourier components at the desired notch frequencies.

Figure 8:
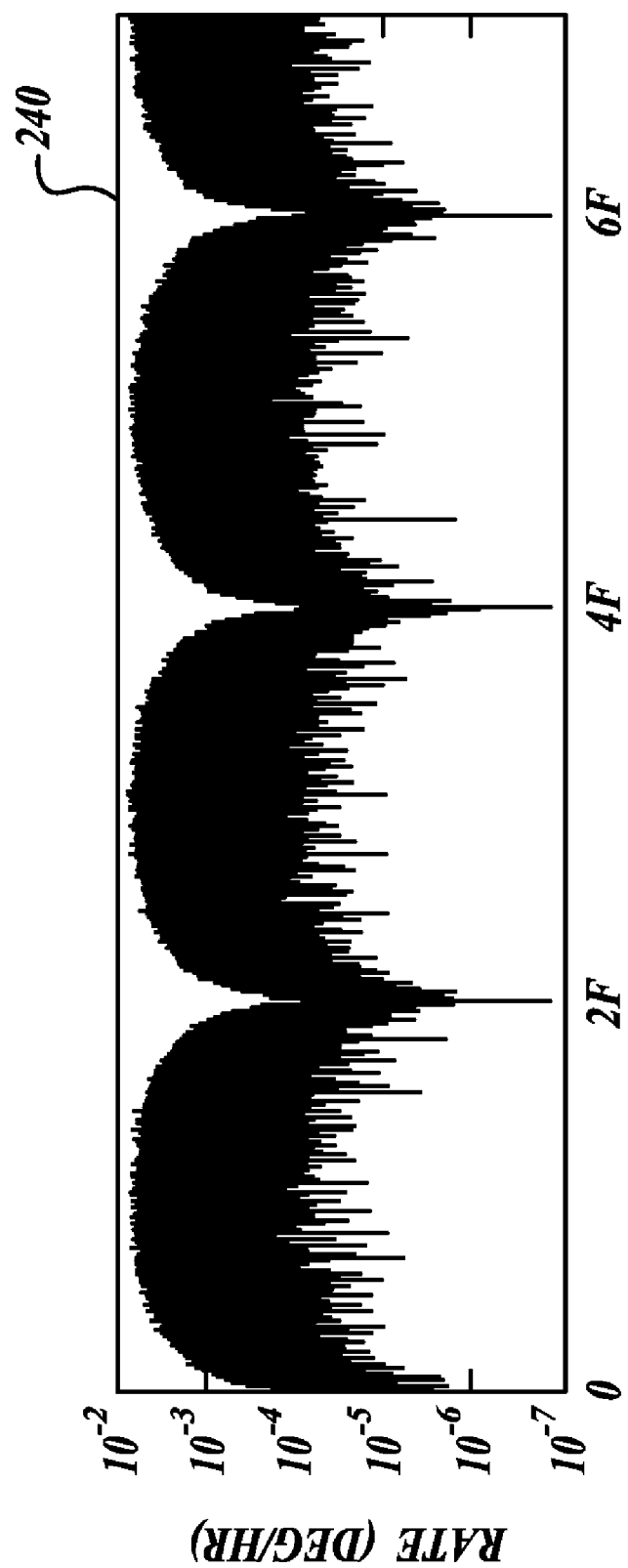
FIG. 8 illustrates an example graph of the noise generated by the components shown in FIGS. 6 and 7.

The noise spectrum of an example output of the addition component 114 is illustrated in FIG. 8 in a chart 240. The amount of delay produced by the delay device 112 dictates where the low noise points (notches) occur within the frequency domain as shown in the chart 140. In one embodiment, the notches occur at even harmonics (2F, 4F, 6F), thus providing low noise situations generated by the noise generator at the approximate frequency of operation of the converter. The notches may occur at other frequencies based on a designer's preference.

The notch frequencies of the noise is associated with the modulation/demodulation frequency. In the case of FOGs, the optimum modulation/demodulation frequency is determined by the length of the sensing coil. This frequency is called the eigen frequency or the proper frequency. Various FOG rotation sensing errors are reduced or eliminate by operating at the eigen frequency. Other sensors, such as the resonator fiber optic gyro (RFOG) have certain modulation/demodulation frequencies that result in optimized performance.

FIG. 7 illustrates a noise generator 72b formed in accordance with an alternate embodiment of the present invention. The generator 72b receives a start pulse 224 at a first random number generator 228 and simultaneously at a delay device 226. The delay device 226 delays the start pulse 224 from reaching a second random number generator 230. The first and second random number generators 228 and 230 are identical random noise generators having an identical seed supplied by a seed component 232. The output of the first and second random number generators 228 and 230 are then supplied to a addition element 236 that adds the output of the second random number generator 230 from the first random number generator 228 to produce a notched noise signal such as that shown in FIG. 8.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method for improving efficiency of a data converter, the method comprising:
    generating a noise signal;
    altering a frequency spectrum of the noise signal based on operation of an associated sensor; and
    supplying the altered frequency spectrum noise signal to the data converter,
    wherein altering the frequency spectrum includes:
        seeding first and second random number generators with seeds;
        delaying the operation of the first random number generator; and
        adding the output of the delayed first random number generator to the second random number generator.

2. The method of claim 1, wherein the data converter is a digital-to-analog converter.

3. The method of claim 1, wherein the converter is an analog-to-digital converter.

4. The method of claim 1, wherein the altered spectrum noise signal is notched.

5. The method of claim 4, wherein the notches are based on a frequency of interest.

6. The method of claim 1, wherein altering the frequency spectrum includes seeding first and second identical random number generators with identical seeds.

7. A system for improving efficiency of a data converter, the system comprising:
    a generator configured to generate a noise signal;
    a component configured to alter a frequency spectrum of the noise signal based on operation of an associated sensor; and
    a summator configured to add the altered frequency spectrum noise signal to a signal received by the data converter,
    wherein the component includes:
        first and second random number generators configured to generate random numbers;
        a seeding component configured to seed the first and second random number generators;
        a delay component configured to delay the operation of the first random number generator; and
        an addition component configured to add the output of the delayed first random number generator to the output of the second random number generator.

8. The system of claim 7, wherein the altered spectrum noise signal is a digital signal.

9. The system of claim 8, wherein the digital signal is sent to a digital-to-analog converter.

10. The system of claim 8, further comprising a digital-to-analog converter configured to convert the digital signal to an analog signal, the analog signal being sent to an analog-to-digital converter.

11. The system of claim 7, wherein the altered spectrum noise signal is notched.

12. The system of claim 11, wherein the notches are based on a frequency of interest.

13. A system for improving efficiency of a data converter, the system comprising:
    a generator configured to generate a noise signal;
    a component configured to alter a frequency spectrum of the noise signal based on operation of an associated sensor; and a summator configured to add the altered frequency spectrum noise signal to a signal received by the data converter, wherein the component includes:
   first and second identical random number generators configured to generate random numbers;
   a seeding component configured to seed the first and second identical random number generators;
   a delay component configured to delay the operation of the first random number generator; and
   an addition component configured to add the output of the delay component to the output of the second random number generator.

* * * * *